United States Patent [19]

Fujima

[11] Patent Number: 5,682,105
[45] Date of Patent: Oct. 28, 1997

[54] BONDING OPTION CIRCUIT HAVING NO PASS-THROUGH CURRENT

[75] Inventor: Shiro Fujima, Tokyo, Japan

[73] Assignee: NEC Corporation, Tokyo, Japan

[21] Appl. No.: 564,450

[22] Filed: Nov. 29, 1995

[30] Foreign Application Priority Data

Nov. 29, 1994 [JP] Japan .................. 6-294851

[51] Int. Cl.$^6$ ........................ H03K 19/0948
[52] U.S. Cl. .................. 326/30; 326/38; 326/83; 326/87; 327/198; 327/313
[58] Field of Search ................ 326/38, 30, 83, 326/86–87, 23–24, 62, 68; 327/198, 313, 333, 391

[56] References Cited

U.S. PATENT DOCUMENTS

| | | | |
|---|---|---|---|
| 4,307,306 | 12/1981 | Kucharewski | 327/198 |
| 5,329,174 | 7/1994 | Chiang | 327/313 |
| 5,412,333 | 5/1995 | Okunga | 327/198 |
| 5,420,526 | 5/1995 | Fensch | 326/30 |

Primary Examiner—Edward P. Westin
Assistant Examiner—Jon Santamauro
Attorney, Agent, or Firm—Foley & Lardner

[57] ABSTRACT

A bonding option circuit comprises a logic gate circuit connected between a bonding pad and a power supply voltage, a load capacitance connected between ground and the logic gate circuit, and an output stabilizer circuit having an input connected to the bonding pad and an output connected to an output terminal. The logic circuit is so configured that when the bonding pad is in a floating condition, the logic circuit connects the bonding pad to the power supply voltage, and when the bonding pad is bonded to the ground, the logic circuit disconnects a current path between the bonding pad and the power supply voltage.

2 Claims, 2 Drawing Sheets

BONDING OPTION CIRCUIT HAVING NO PASS-THROUGH CURRENT

BACKGROUND OF THE INVENTION

1. Field of the Invention

The present invention relates to a bonding option circuit for use in a semiconductor device, and more specifically to a bonding option circuit for switching over an internal operation in an integrated circuit.

2. Description of Related Art

In the prior art, the bonding option circuit is used in an integrated circuit required to operate with a low consumed power, for example, in a DRAM (dynamic random access memory). The bonding option circuit is used as a switching-over means for changing an internal processing capacity or a mode, by bringing a bonding pad as an input terminal, either to a ground level or to a power supply voltage level.

Referring to FIG. 1, there is shown a circuit diagram illustrating one example of a conventional bonding option circuit. The shown bonding option circuit includes a driving circuit 5 connected to a bonding pad 1, and an output stabilizer circuit 3 having an input connected to the bonding pad 1 and an output connected to an output terminal OUT, so that at a powering-on (but, a power switch is not shown), the output terminal OUT is forcibly brought to either a ground level ("0" level) or a power supply voltage level ("1" level).

The driving circuit 5 includes a plurality of gate-grounded P-channel transistors P3 to P6 connected in series between a power supply voltage $V_{DD}$ and the bonding pad 1. The output stabilizer circuit 3 includes a plurality of inverters I3 to I5 connected in cascade between the bonding pad 1 and the output terminal OUT, and a P-channel transistor P2 connected between the power supply voltage $V_{DD}$ and the bonding pad 1 and having a gate connected to an output of the inverter I3.

The shown circuit is one example in which the ground level is supplied to the bonding pad 1 by a bonding connection, so that the "1" level is outputted from the output terminal OUT. In this case, if no bonding connection is made so that the bonding pad 1 is not grounded, namely, if the bonding pad 1 is in a floating condition, a node S6 is brought to the "1" level through the series-connected P-channel transistors P3 to P6, so that the output terminal OUT is brought to the "0" level.

Therefore, depending upon whether or not the pad 1 is grounded by the bonding connection, an output signal available on the output terminal OUT can be selectively switched to either one of two logical levels (namely, either the "0" level or the "1" level), so that it is possible to change an internal operation of the integrated circuit.

For example, in a 4 mega DRAM, as an internal operation, a word construction can be switched over between 256K words×16 bits and 512K words×8 bits, and a refresh cycle can be changed between 1024 refreshes and 512 refreshes. In addition, a byte control such as 2CAS (column address strobe) and 2WE (write enable) can be switched over, and a function mode such as a fast page, a hyper page, a static column, a write per bit, etc. can be selected.

In the conventional practice, in an integrated circuit typified by a DRAM, a plurality of bonding option circuits are used or combined, so that a few kinds of products can be produced from the same chips.

In the above mentioned conventional bonding option circuit, when the pad is grounded by the bonding connection so as to cause the circuit to output an output signal of the "1" level, a pass-through current flows from the power supply through the P-channel transistors P3 to P6 to the bonding pad 1. Ordinarily, since these transistors have such a size that the channel width is 3 µm and the channel length is 300 µm, when the power supply voltage is 3.3 V, the pass-through current reaches 0.2 µA to 0.3 µA.

In order to reduce this pass-through current, for example, it may be considered to elongate the channel length so that the driving power of the transistors drops. In this approach, however, when no bonding connection is made so that the pad is not grounded, namely, the pad is in a floating condition, it becomes difficult to maintain the node S6 at the "1" level because of an adverse influence such as noises. Therefore, there is a fear that the option circuit itself causes malfunction. In this case, furthermore, the pass-through current does not become zero.

Furthermore, in a conventional practice, a plurality of bonding option circuits are often used in combination. Therefore, the pass-through current increases in proportion to the number of the bonding option circuits having the bonding pad grounded by the bonding connection. This cannot make a standby current small. This is contrary to a recent tendency of integrated circuits, namely, the lowering of the operating voltage leading to reduction of the consumed power.

SUMMARY OF THE INVENTION

Accordingly, it is an object of the present invention to provide a bonding option circuit which has overcome the above mentioned defect of the conventional one.

Another object of the present invention is to provide a bonding option circuit having no pass-through current which was inevitable in the conventional bonding option circuit, with using no transistor having a long channel length so that a necessary layout area can be reduced.

The above and other objects of the present invention are achieved in accordance with the present invention by a bonding option circuit comprising a bonding pad, a logic gate circuit connected between the bonding pad and one of a power supply voltage and ground, a load capacitance connected between the ground and one of the bonding pad and the logic gate circuit, and an output stabilizer circuit having an input connected to the bonding pad and an output connected to an output terminal, the logic circuit being so configured that when the bonding pad is in a floating condition, the logic circuit connects the bonding pad to the one of the power supply voltage and the ground, and when the bonding pad is bonded to the other of the power supply voltage and the ground, the logic circuit disconnects a current path between the bonding pad and the one of the power supply voltage and the ground.

In one embodiment, the logic circuit includes a P-channel transistor connected between the bonding pad and the power supply voltage, a first N-channel transistor connected between the bonding pad and the power supply voltage, a first inverter having an input connected to the bonding pad and an output connected to a gate of the P-channel transistor, a second inverter having an input connected to the output of the first inverter and an output connected to a gate of the first N-channel transistor, and a second N-channel transistor connected between the output of the first inverter and the ground and having a gate connected to the bonding pad, the load capacitance being connected between the gate of the P-channel transistor and the ground.

In another embodiment, the logic circuit includes a P-channel transistor connected between the bonding pad and the power supply voltage, an N-channel transistor connected between the bonding pad and the ground, an inverter having an input connected to the bonding pad and an output connected to a gate of the P-channel transistor and a gate of the N-channel transistor, the load capacitance being connected between the bonding pad and the ground.

The above and other objects, features and advantages of the present invention will be apparent frown the following description of preferred embodiments of the invention with reference to the accompanying drawings.

DESCRIPTION OF PREFERRED EMBODIMENTS

Figure 2:
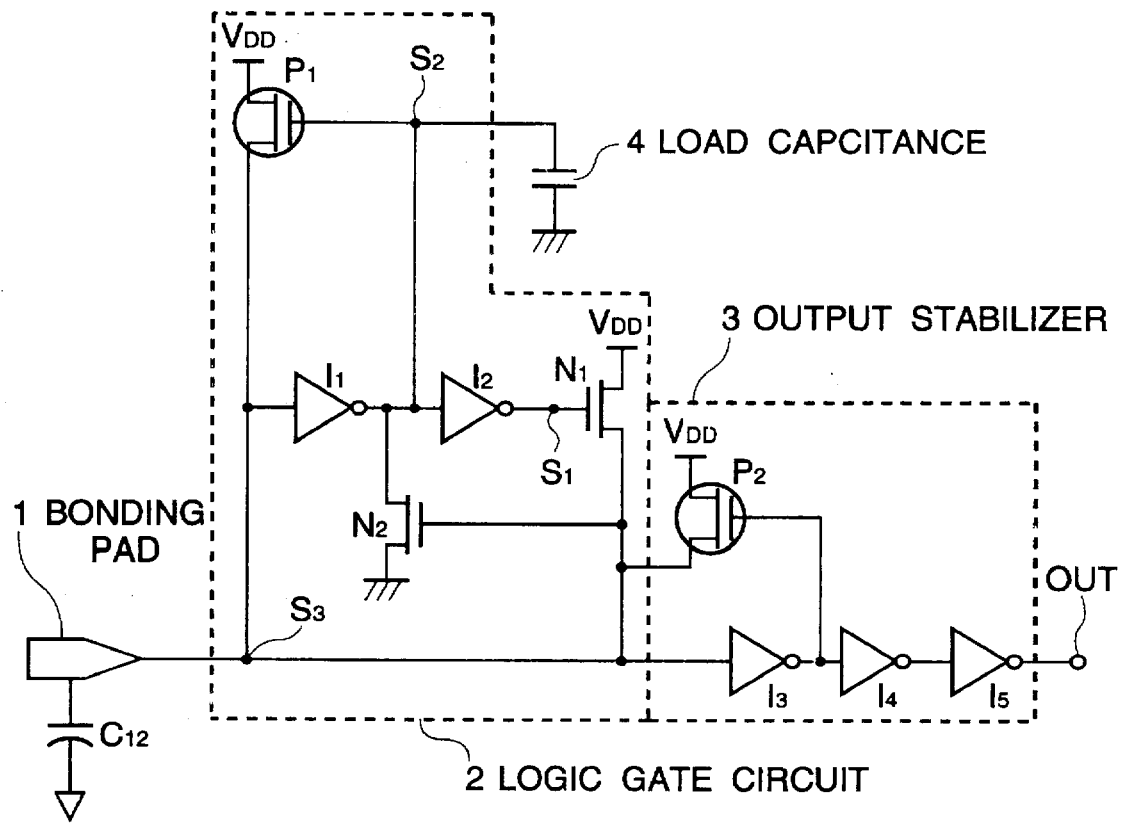
FIG. 2 is a circuit diagram of a first embodiment of the bonding option circuit in accordance with the present invention.

Referring to FIG. 2, there is shown a circuit diagram of a first embodiment of the bonding option circuit in accordance with the present invention.

The shown embodiment includes a bonding pad 1, a logic gate circuit 2 connected to the bonding pad 1 and composed of a P-channel transistor P1, N-channel transistors N1 and N2 and inverters I1 and I2, an output stabilizer circuit 3 having an input connected to the bonding pad 1 and an output connected to an output terminal OUT, and a load capacitance 4 connected to the logic gate circuit 2. This output stabilizer circuit 3 is of the same construction as the corresponding one shown in FIG. 1.

In the logic gate circuit 2, specifically, the P-channel transistor P1 is connected between the bonding pad 1 (node S3) and a power supply voltage $V_{DD}$, and also, the first N-channel transistor N1 connected between the bonding pad 1 and a power supply voltage $V_{DD}$. The inverter I1 has an input connected to the bonding pad 1 and an output connected at a node S2 to a gate of the P-channel transistor P1, and the inverter I2 has an input connected to the output of the inverter I1 and an output connected at a node S1 to a gate of the first N-channel transistor N1. The second N-channel transistor N2 is connected between the output of the inverter I1 and the ground and has a gate connected to the bonding pad 1. The load capacitance 4 is connected between the gate of the P-channel transistor P1 and the ground.

In operation, when the bonding pad 1 is bonded to the ground level, the node S1 is brought to the "0" level by action of the cascaded inverters I1 and I2 in the logic gate circuit 2, and therefore, the first N-channel transistor N1 is turned off. In addition, since the node S2 is brought to the "1" level by action of the inverter I1, the P-channel transistor P1 is turned off. Therefore, since both of the transistors N1 and P1 are off, no pass-through current flows from the power supply voltage $V_{DD}$ to the ground. On the other hand, since the bonding pad 1 is bonded to the ground level, the "1" level is outputted from the output terminal OUT by action of the output stabilizer circuit 3.

If the bonding pad 1 is not bonded, namely, if the bonding pad 1 is in a floating condition, when the power is switched on, the node S2 is difficult to immediately become the "1" level, namely, the node S2 slowly goes towards the "1" level, because of the lead capacitance 4. Accordingly, rather, the node S1 becomes the "1" level by action of the inverter I2, so that the N-channel transistor N1 is turned on. Therefore, the node S3 becomes the "1" level before the node S2 reaches the "1" level. At this time, since the second N-channel transistor N2 is turned on, the node S2 is forcibly brought to the "0" level. Namely, by the action of the loop composed of the inverter I2 and the N-channel transistors N1 and N2, the node S3 is forcibly brought to the "1" level and the node S2 is forcibly brought to the "0" level. As a result, the "0" level is outputted from the output terminal OUT by action of the output stabilizer circuit 3.

The node S3 which has been brought to the "1" level by the above mentioned process, is maintained at the "1" level, by action of the P-channel transistor P2 in the output stabilizer circuit 3.

In the above mentioned operation, it is important that when the power is switched on, the level of the node S3 becomes the "1" level faster than the level of the node S2. For this purpose, the lead capacitance 4 is required to be sufficiently larger than a parasitic capacitance C12 of the bonding pad 1.

Figure 3:
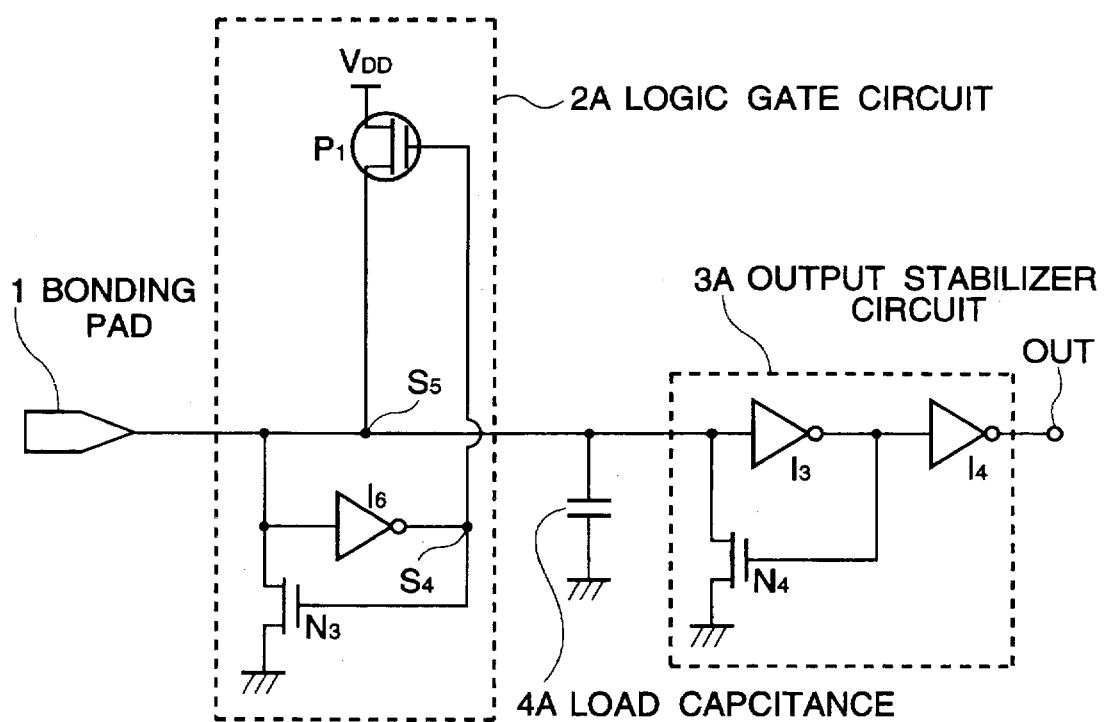
FIG. 3 is a circuit diagram of a second embodiment of the bonding option circuit in accordance with the present invention.

Referring to FIG. 3, there is shown a circuit diagram of a second embodiment of the bonding option circuit in accordance with the present invention.

The second embodiment includes a bonding pad 1, a logic gate circuit 2A connected to the bonding pad 1 and composed of a P-channel transistor P1, an N-channel transistor N3 and an inverter I6, a load capacitance 4A connected between the bonding pad 1 and the ground, and an output stabilizer circuit 3A having an input connected to the bonding pad 1 and an output connected to an output terminal OUT.

In the logic gate circuit 2A, specifically, the P-channel transistor P1 is connected between the power supply voltage $V_{DD}$ and the bonding pad 1 (node S5), and the N-channel transistor N3 is connected between the bonding pad 1 and the ground. The inverter I6 has an input connected to the bonding pad 1 and an output connected to a node S4 to both a gate of the P-channel transistor P1, and a gate of the N-channel transistor N1.

The output stabilizer circuit 3A includes a pair of cascaded inverters I3 and I4, the inverter I3 having an input connected to the bonding pad 11 and the inverter I4 having an input connected to an output of the inverter I3 and an output connected to the output terminal OUT. The output stabilizer circuit 3A also includes an N-channel transistor N4 connected between the bonding pad 1 and the ground and having a gate connected to the output of the inverter I3.

The bonding option circuit of the second embodiment is configured to output the "1" level at the output terminal OUT when the bonding pad 1 is bonded to the power supply voltage $V_{DD}$.

In operation, if the bonding pad 1 is bonded to the power supply voltage, the node S4 is brought to the "0" by the action of the inverter I6, so that the N-channel transistor N1 is turned off and the P-channel transistor P1 is turned on. Therefore, the node S5 is pulled up to $V_{DD}$. As a result, the "1" level is outputted from the output terminal OUT by action of the output stabilizer circuit 3A. In this condition, no pass-through current flows in the logic gate circuit 2A from the power supply voltage $V_{DD}$ to the ground, and from the bonding pad 1 to the ground.

On the other hand, if the bonding pad 1 is not bonded, namely, if the bonding pad 1 is in a floating condition, the node S4 is pulled up to the "1" level, faster than the node S5 connected to the load capacitance 4. Accordingly, the P-channel transistor P1 is turned off, and the N-channel transistor N1 is turned on. Therefore, the node S5 is brought to and maintained at the "0" level. Accordingly, the "0" level is outputted from the output terminal OUT by action of the output stabilizer circuit 3A. In addition, in this situation, no pass-through current flows in the logic gate circuit 2A from the power supply voltage $V_{DD}$ to the ground.

Figure 1:
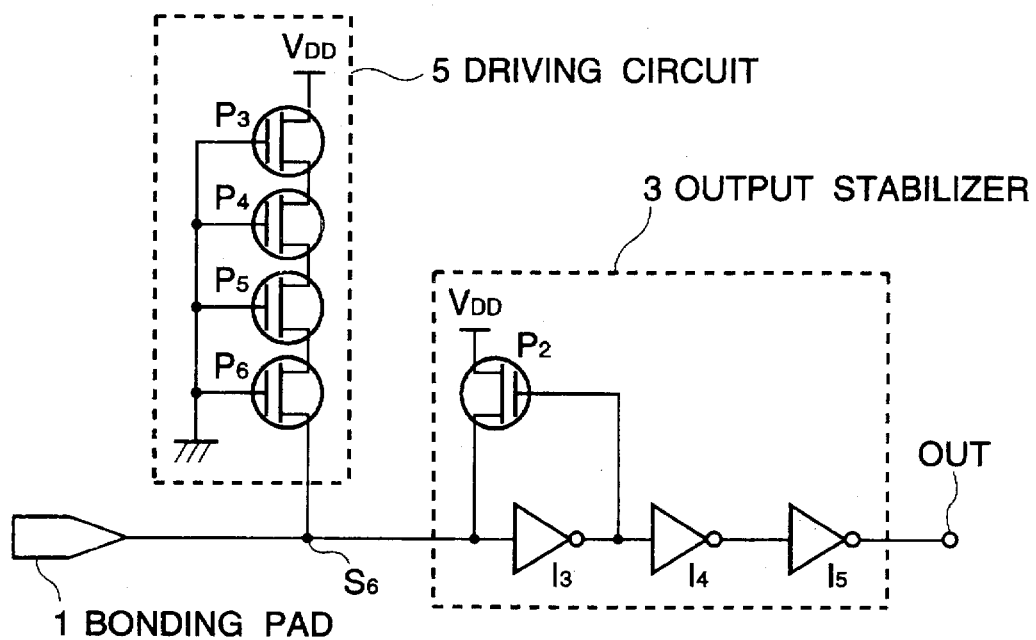
FIG. 1 is a circuit diagram of a conventional bonding option circuit.

As seen from the above, the above mentioned embodiments are not required to use the driver circuit 5 composed of a cascaded transistors P3 to P6, which were used in the conventional example shown in FIG. 1, and each of which is required to have a very long channel length. Therefore, the above mentioned embodiments can reduce a necessary layout area to about a half.

In the first embodiment as mentioned above, if the bonding pad is bonded to the ground level, when the power is switched on, the logic gate circuit acts to cut off the transistor which is provided to pull up the node connected to the bonding pad. Therefore, the pass-through current flowing from the power supply voltage level to the ground level can be made zero. In the second embodiment as mentioned above, if the bonding pad is bonded to the power supply voltage level, when the power is switched on, the logic gate circuit acts to cut off the transistor which is provided to pull down the node connected to the bonding pad. Therefore, the pass-through current flowing from the power supply voltage level to the ground level can be made zero. For example, the bonding option circuit of the present invention can reduce the standby current by about 10% in a 4 mega DRAM having six bonding option circuits.

The invention has thus been shown and described with reference to the specific embodiments. However, it should be noted that the present invention is in no way limited to the details of the illustrated structures but changes and modifications may be made within the scope of the appended claims.

I claim:

1. A bonding option circuit comprising a bonding pad, a logic gate circuit connected between said bonding pad and one of a power supply voltage and ground, a load capacitance connected between said ground and said logic gate circuit, and an output stabilizer circuit having an input connected to said bonding pad and an output connected to an output terminal, said logic circuit being so configured that when said bonding pad is in a floating condition, said logic circuit connects said bonding pad to said one of said power supply voltage and said ground, and when said bonding pad is bonded to the other of said power supply voltage and said ground, said logic circuit disconnects a current path between said bonding pad and said one of said power supply voltage and said ground;

wherein said logic circuit includes a P-channel transistor connected between said bonding pad and said power supply voltage, a first N-channel transistor connected between said bonding pad and said power supply voltage, a first inverter having an input connected to said bonding pad and an output connected to a gate of said P-channel transistor, a second inverter having an input connected to said output of said first inverter and an output connected to a gate of said first N-channel transistor, and a second N-channel transistor connected between said output of said first inverter and said ground and having a gate connected to said bonding pad, said load capacitance being connected between said gate of said P-channel transistor and said ground.

2. A bonding option circuit comprising a bonding pad, a logic gate circuit connected between said bonding pad and one of a power supply voltage and ground, a load capacitance connected between said ground and said logic gate circuit, and an output stabilizer circuit having an input connected to said bonding pad and an output connected to an output terminal, said logic circuit being so configured that when said bonding pad is in a floating condition, said logic circuit connects said bonding pad to said one of said power supply voltage and said ground, and when said bonding pad is bonded to the other of said power supply voltage and said ground, said logic circuit disconnects a current path between said bonding pad and said one of said power supply voltage and said ground;

wherein said logic circuit includes a P-channel transistor connected between said bonding pad and said power supply voltage, an N-channel transistor, an inverter having an input connected to said bonding pad and an output connected to a gate of said P-channel transistor, a gate of said N-channel transistor being controlled by said output of said inverter;

wherein said load capacitance is connected between said ground and said gate of said P-channel transistor, and said N-channel transistor is connected between said bonding pad and said power supply voltage, and wherein said output of said inverter is connected to an input of a second inverter having an output connected to said gate of said N-channel transistor, and a second N-channel transistor is connected between said input of said second inverter and said ground, a gate of said second N-channel transistor being connected to said bonding pad.

* * * * *